United States Patent
Liu et al.

(10) Patent No.: US 9,577,314 B2
(45) Date of Patent: Feb. 21, 2017

(54) HYBRID ON-CHIP AND PACKAGE ANTENNA

(71) Applicant: INTERNATIONAL BUSINESS MACHINES CORPORATION, Armonk, NY (US)

(72) Inventors: Duixian Liu, Scarsdale, NY (US); Arun S. Natarajan, Corvallis, OR (US); Jean-Olivier Plouchart, New York, NY (US); Scott K. Reynolds, Amawalk, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 466 days.

(21) Appl. No.: 13/796,404

(22) Filed: Mar. 12, 2013

(65) Prior Publication Data

US 2014/0071021 A1 Mar. 13, 2014

Related U.S. Application Data

(60) Provisional application No. 61/699,899, filed on Sep. 12, 2012.

(51) Int. Cl.
*H01Q 1/22* (2006.01)
*H01Q 1/36* (2006.01)
(Continued)

(52) U.S. Cl.
CPC .......... *H01Q 1/2283* (2013.01); *H01L 21/302* (2013.01); *H01L 21/486* (2013.01);
(Continued)

(58) Field of Classification Search
CPC ....................................................... H01Q 1/36
(Continued)

(56) References Cited

U.S. PATENT DOCUMENTS

| 4,458,249 A * | 7/1984 | Valentino | H01Q 25/008 343/754 |
| 4,992,628 A * | 2/1991 | Beppu | H01L 23/057 174/530 |

(Continued)

OTHER PUBLICATIONS

Filipovic, D., et al. "Off-Axis Properties of Silicon and Quartz Dielectric Lens Antennas" IEEE Transactions on Antennas and Propagation, vol. 45, No. 5. May 1997. pp. 760-766.
(Continued)

*Primary Examiner* — Dameon E Levi
*Assistant Examiner* — Walter Davis
(74) *Attorney, Agent, or Firm* — Tutunjian & Bitetto, P.C.; Vazken Alexanian

(57) ABSTRACT

Antenna devices, antenna systems and methods of their fabrication are disclosed. One such antenna device includes a semiconductor chip and a chip package. The semiconductor chip includes at least one antenna that is integrated into a dielectric layer of the semiconductor chip and is configured to transmit electromagnetic waves. In addition, the chip package includes at least one ground plane, where the semiconductor chip is mounted on the chip package such that the ground plane(s) is disposed at a predetermined distance from the antenna to implement a reflection of at least a portion of the electromagnetic waves.

17 Claims, 10 Drawing Sheets

(51) Int. Cl.
    *H01L 21/50*           (2006.01)
    *H01L 23/522*         (2006.01)
    *H01L 21/302*         (2006.01)
    *H01L 21/48*           (2006.01)
    *H01L 23/66*           (2006.01)

(52) U.S. Cl.
    CPC .......... *H01L 21/50* (2013.01); *H01L 23/5227* (2013.01); *H01L 23/66* (2013.01); *H01Q 1/36* (2013.01); *H01L 2223/6677* (2013.01); *H01L 2224/0401* (2013.01); *H01L 2224/04042* (2013.01); *H01L 2224/0557* (2013.01); *H01L 2224/16225* (2013.01)

(58) Field of Classification Search
    USPC ............................................ 343/893; 174/52
    See application file for complete search history.

(56) References Cited

U.S. PATENT DOCUMENTS

| | | |
|---|---|---|
| 5,534,094 A | 7/1996 | Arjavalingam et al. |
| 6,770,955 B1 | 8/2004 | Coccioli et al. |
| 7,675,465 B2 | 3/2010 | Doan et al. |
| 8,144,059 B2 | 3/2012 | Lynch |
| 8,164,167 B2 | 4/2012 | Zhang et al. |
| 8,256,685 B2 | 9/2012 | Chen et al. |
| 2006/0276157 A1 | 12/2006 | Chen et al. |
| 2010/0003395 A1 | 1/2010 | Shimizu et al. |
| 2010/0193935 A1* | 8/2010 | Lachner ............... H01Q 1/2283 257/693 |
| 2011/0169115 A1 | 7/2011 | Lin |
| 2011/0175793 A1* | 7/2011 | Suzuki ................. H01L 23/552 343/905 |
| 2011/0181484 A1* | 7/2011 | Pettus et al. .................. 343/833 |
| 2011/0285011 A1 | 11/2011 | Hwang et al. |
| 2011/0291111 A1 | 12/2011 | Nagai et al. |
| 2012/0263244 A1 | 10/2012 | Kyles et al. |

OTHER PUBLICATIONS

Patent Cooperation Treaty. "Notification of Transmittal of the International Search Report and the Written Opinion" Issued for PCT/US2013/059401 on Mar. 11, 2014. (17 Pages).

\* cited by examiner

HYBRID ON-CHIP AND PACKAGE ANTENNA

RELATED APPLICATION INFORMATION

This application claims priority to provisional application Ser. No. 61/699,899 filed on Sep. 12, 2012, incorporated herein by reference.

BACKGROUND

Technical Field

The present invention relates to antenna devices, and, more particularly, to on-chip antenna structures and methods of manufacturing on-chip antenna structures.

Description of the Related Art

Antennas for devices that employ wireless communication have traditionally been formed off-chip and subsequently coupled to an integrated circuit. However, as the size of communication devices have been scaled down over the years, there has been an increasing demand for more compact antenna structures. While specialized board technologies may be used to fabricate antennas therein, they are often unsuitable for certain applications. For example, for devices that employ frequencies of 60 GHz or higher, the design of antenna into specialized board technologies are quit challenging, as the tolerances of the board technologies are several orders of magnitude higher than microelectronic technologies. Transmitting the millimeter wave signal outside of the chip up to the antenna presents another significant challenge. Thus, one popular means of fabricating antenna devices integrates the antenna on-chip into microelectronic silicon structures.

The current state of the art of integrating antenna into a microelectronic silicon technology, for both RF and mm wave frequencies, provides structures that have a relatively low efficiency due to the loss of transmissions into a lossy silicon substrate and due to the fact that the antenna ground cannot be placed at a sufficient distance away from the antenna. For example, microelectronic silicon structures provide a limited distance (less than 15 μm) between the last layer of metal in which the antenna is situated and the first layer of metal where the ground plane is integrated. As such, state of the art on-chip antennas exhibit lower efficiency and provide a narrower bandwidth than antennas designed into specialized technologies. Further, their product applications are very limited.

SUMMARY

One embodiment of the principles is directed to an antenna device including a semiconductor chip and a chip package. The semiconductor chip includes at least one antenna that is integrated into a dielectric layer of the semiconductor chip and is configured to transmit electromagnetic waves. In addition, the chip package includes at least one ground plane, where the semiconductor chip is mounted on the chip package such that the ground plane(s) is disposed at a predetermined distance from the antenna to implement a reflection of at least a portion of the electromagnetic waves.

An alternative embodiment is directed to a method for fabricating an antenna device for microwave transmissions. The method includes forming an antenna structure including at least one antenna that is integrated into a dielectric layer of a semiconductor chip and is configured to transmit electromagnetic waves having a microwave wavelength (λ). In addition, a ground plane structure is formed separately from the antenna structure. Here, the ground plane structure includes at least one integrated ground plane that is configured to reflect the electromagnetic waves. Further, the antenna structure is mounted to the ground plane structure such that the ground plane(s) is at a distance (d) of $$\frac{1}{20}\lambda < d \leq \frac{1}{4}\lambda$$

from the antenna(s).

Another embodiment is directed to an antenna system. The system includes a plurality of semiconductor chips on a wafer, where each of the semiconductor chips includes at least one antenna that is integrated into a dielectric layer of the semiconductor chip and is configured to transmit electromagnetic waves. The system further comprises a wafer-scale chip package that includes ground planes, where the semiconductor chips and the wafer are mounted on the chip package such that the ground planes are disposed at predetermined distances from the antennas of the semiconductor chips to implement a reflection of at least a portion of the electromagnetic waves.

Another embodiment is directed to a method for fabricating an antenna device. In accordance with the method, at least one antenna is formed in an antenna layer structure including antenna components and a substrate material. Further, the antenna layer structure is transported onto a transparent support structure. At least part of the substrate material is removed to form an antenna chip layer and the antenna chip layer is attached to a glass wafer. The transparent support structure is released from the antenna chip layer and the antenna chip layer is mounted onto a carrier layer including at least one integrated ground plane.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
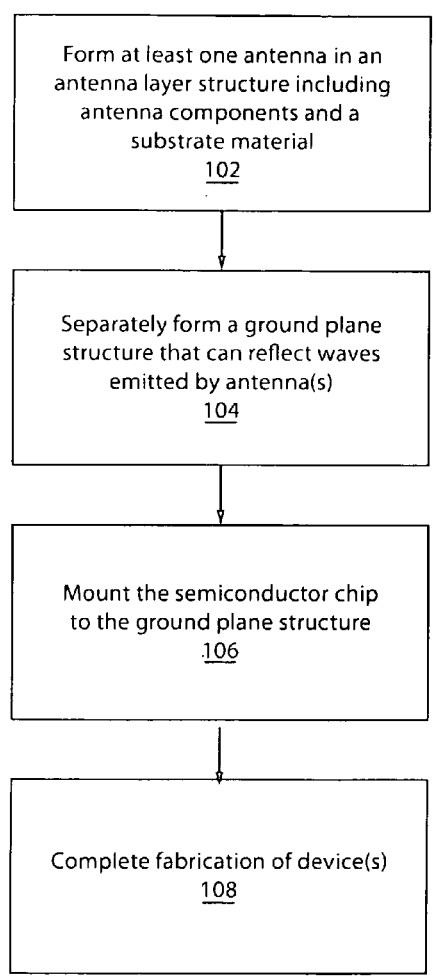
FIG. 1 is a block/flow diagram of a method for fabricating an antenna device in accordance with an exemplary embodiment.

The preferred embodiments described herein are directed to on-chip antennas that provide both a broadband and a high transmission efficiency. In particular, the embodiments described herein employ a hybrid antenna system that is integrated in both a semiconductor chip of an integrated circuit and in the chip package. For example, as discussed herein below, antennas can be formed within a semiconductor chip, while a ground plane can be formed within the chip package. Here, an optimal spacing for reflection purposes can be implemented through the use of electrical couplers or through appropriate etching of a substrate of the semiconductor chip. Thus, in contrast to the microelectronic silicon technologies and specialized board technologies described above, the hybrid systems described herein can achieve an optimal and accurate spacing between antennas and a ground plane. Moreover, as discussed in more detail herein below, the efficiency can be further improved by employing a highly transparent cap as opposed to lossy silicon materials used in current fabrication methods.

As will be appreciated by one skilled in the art, aspects of the present invention may be embodied as a system, method or device. Aspects of the present invention are described below with reference to flowchart illustrations and/or block diagrams of methods, apparatus (systems) and devices according to embodiments of the invention.

The flowchart and block diagrams in the Figures illustrate the architecture, functionality, and operation of possible implementations of systems, methods and devices according to various embodiments of the present invention. It should also be noted that, in some alternative implementations, the features noted in the blocks may occur out of the order noted in the figures. For example, two method blocks shown in succession may, in fact, be executed substantially concurrently, or the blocks may sometimes be executed in the reverse order, depending upon the functionality involved.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "under" another element, it can be directly beneath the other element or intervening elements may also be present. In contrast, when an element is referred to as being "directly beneath" or "directly under" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Further, although the antenna "ground plane" is implemented in the board as a preferred embodiment herein below, the "ground plane" can simply be a reflector, depending on the antenna design.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
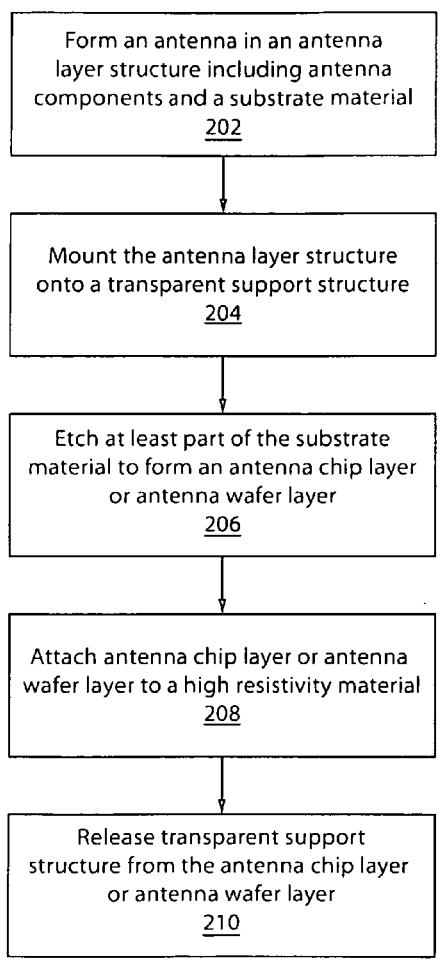
FIG. 2 a block/flow diagram of a method for forming an antenna structure in accordance with an exemplary embodiment.
Figure 3:
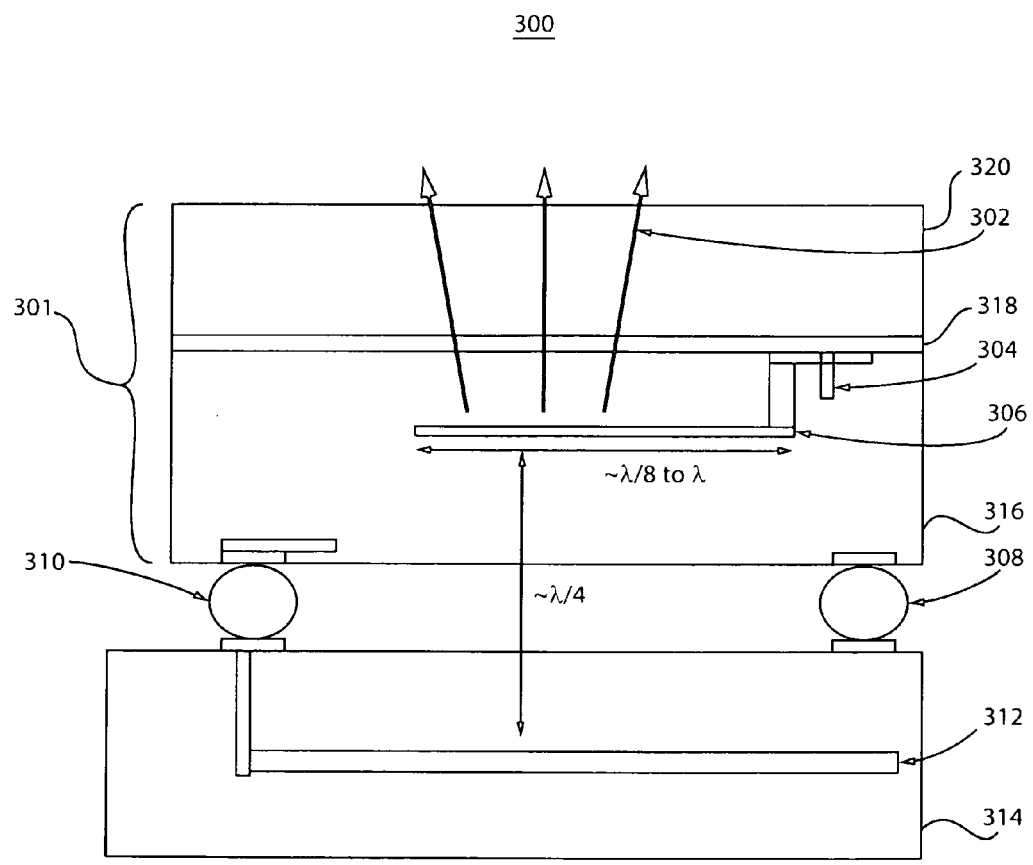
FIG. 3 is a cross-sectional view of an exemplary antenna device including a high-resistivity cap in accordance with an exemplary embodiment.
Figure 11:
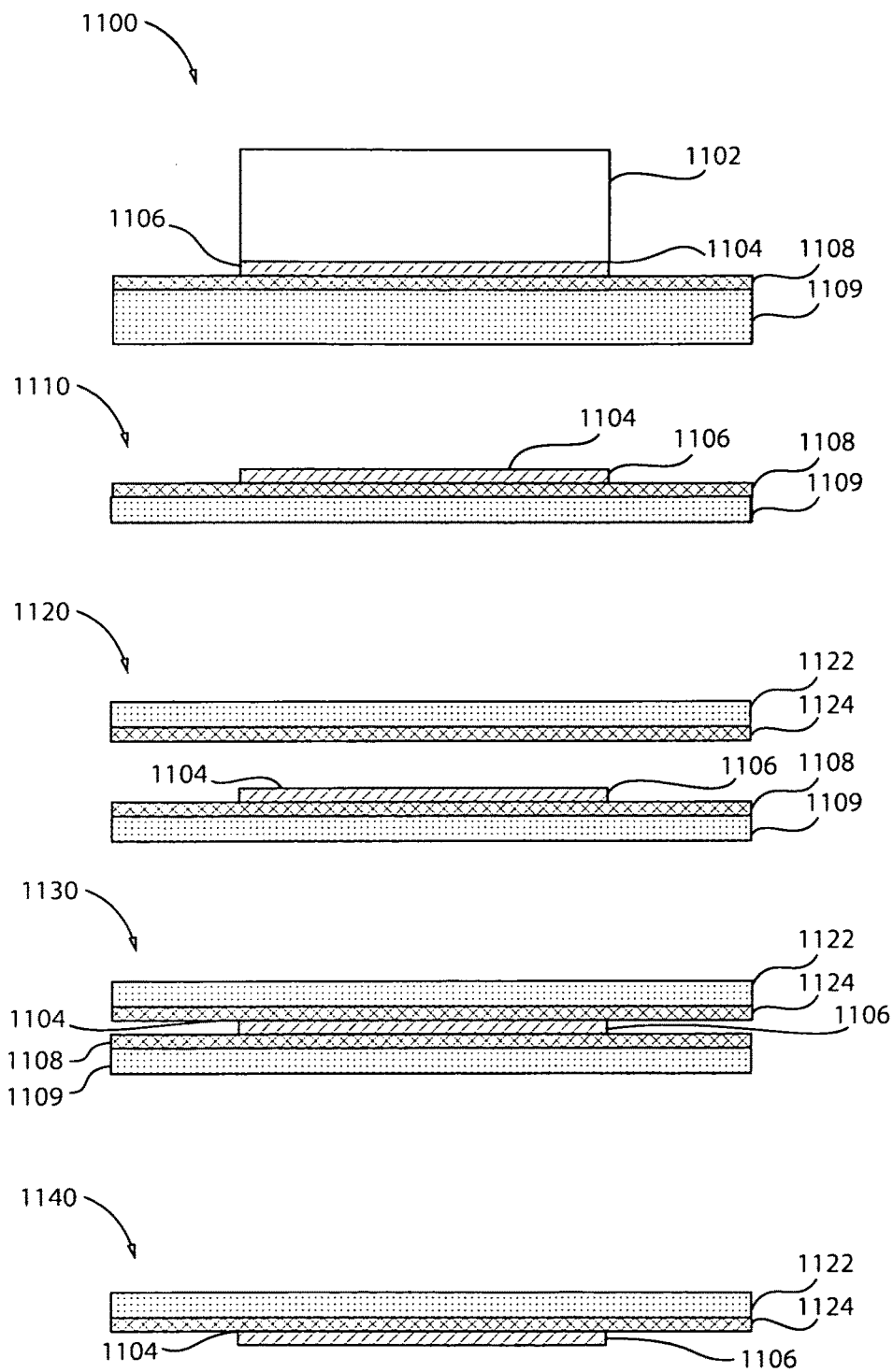
FIG. 11 illustrates cross-sectional views of various structures formed during stages of the method of FIG. 2.

Referring now to the drawings in which like numerals represent the same or similar elements and initially to FIG. 1, an exemplary method 100 for fabricating an antenna device is illustratively depicted. The method 100 can begin at step 102, at which an antenna structure including one or more antennas integrated within a semiconductor chip can be formed. As noted above, the efficiency of an antenna device can be improved by employing a highly transparent cap as opposed to lossy silicon materials used in current fabrication methods. For example, FIG. 2 provides a flow diagram of an exemplary method 200 for forming the antenna structure with such a cap that can be performed to implement step 102. In addition, FIG. 11 provides an illustration of the various stages and structures formed in accordance with the method 200. FIG. 3 depicts a more detailed view of an exemplary antenna device 300 that can be fabricated in accordance with the methods 100 and 200. In the device 300, the antennas 306 are integrated on chip and the ground plane 312 is integrated within the board or chip package to reflect the electromagnetic waves toward the top of the chip. As illustrated in FIG. 3, one or more antennas 306 can be formed in a silicon-on-insulator (SOI) structure, which includes an insulator layer 318 and a semiconductor substrate, such as a silicon substrate 1102 illustrated in FIG. 11. Here, the substrate material 1102 can be any low resistivity substrate material with, for example, a resistivity of less than 10 Ohm·cm. Further, the antenna can be insulated with a dielectric material 316. The antenna is coupled to antenna components 304 of an active device of an SOI circuit. In the FIG. 3 embodiment, an SOI circuit is transferred onto a glass substrate to form a Silicon On Glass (SOG) circuit. The glass substrate/carrier has the advantage of having a very high resistivity with a low dielectric constant, thereby providing higher efficiency and wider bandwidth antennas.

The method 200, in accordance with which the antenna structure 301 of FIG. 3 can be formed and with which step 102 of the method 100 can be implemented, can begin at step 202, at which one or more antennas are formed in an antenna layer structure. For example, as illustrated in FIG. 11, the SOI circuitry can be formed on a silicon wafer according to standard processes resulting in a thin layer 1106, for example, 10 microns, of active devices atop a thick silicon supporting substrate 1102, for example, 500-750 microns. It should be noted that the wafers can be used in full form or segmented into chips by wafer dicing, for example, less than one mm on a side and up to greater than 25 mm on a side. In a preferred embodiment, the chip sizes can, for example, vary between 1×1 mm² and 25×25 mm².

At step 204, the antenna layer structure formed in step 202 can be mounted onto a transparent support structure. For example, as illustrated by structure 1100 of FIG. 11, the SOI chip or wafer, including a bulk silicon layer 1102, an insulator layer 1104 and a device layer 1106, can be attached to a mechanical support wafer 1109 using a polymer glue 1108 that is sensitive to a certain light wavelength $\lambda_{polymer}$. In a preferred embodiment, the adhesive 1108 is coated on a borofloat glass 1109 and cured. The adhesive can be cured in an inert gas atmosphere prior to chip attachment/bonding to remove volatiles. In accordance with one exemplary embodiment, the polymer glue 1108 can be a polyamide adhesive (e.g., HD-3007). The mechanical support wafer 1109 used here is transparent at the light wavelength $\lambda_{polymer}$. Thus, the mechanical support can be a glass wafer, as it is transparent to the laser light that is provided on the glue polymer. Glass has also a thermal coefficient of expansion that is close to that of silicon (used in the chip), which is advantageous to reduce stress during process thermal cycles. Some other mechanical supports may be used, such as, for example, sapphire, as long as they are transparent to the laser wavelength. The size of the mechanical glass substrate can be any size from the chip size to a 200 mm, 300 mm, 450 mm wafer size. Further, the thickness of a polyimide adhesive 1108 on a glass carrier 1109 in this embodiment is between 5-10 µm, pre-cure. The wafer or chips can be adhered to glass substrate with the adhesive layer 1108 by applying uniform heat and pressure during the bond process to ensure that air is not trapped in the bond. For example, the temperature can be elevated to the reflow temperature of the adhesive, for example, 300° C. for 10 minutes if the polyamide adhesive is used, and then cooled slowly to room temperature.

At step 206, at least part of the substrate material can be etched to form an antenna chip layer or an antenna wafer layer. As noted above, the substrate material can be any low resistivity substrate material with, for example, a resistivity of less than 10 Ohm·cm. As illustrated by structures 1100 and 1110 of FIG. 11, the chip back-side substrate of a single chip or of multiple chips on the antenna wafer layer can be etched away using mechanical polishing/etching and/or chemical etching and/or plasma etching. Exposed edges of the chip(s) should be protected prior to etching with a resist to prevent side etching and undercutting of silicon, or any other semiconductor material used, within the device circuitry during etching. The etching can be implemented using $XeF_2$ gas. A complete silicon etch can involve removal of the silicon repeatedly using between 400-1000 "cycles," depending on thickness of silicon and square area, until the back side of the SOI circuitry is exposed. The etch rate is silicon-volume dependent. Generally, a single cycle time is ~30 seconds. An advantage of using an SOI structure is that the silicon chemical or plasma etching is very selective with respect to $SiO_2$ of the insulator layer 318, enabling the etching process to be stopped automatically at the appropriate distance without damaging the active devices 304 integrated into the silicon film and isolated from the substrate by the $SiO_2$ box 318.

At step 208, the antenna chip layer or the antenna wafer layer can be attached to a high resistivity material 320. For example, the chip or wafer that is attached to the mechanical support wafer may then be attached to a transparent wafer, such as glass, or any material with a high resistivity of, for example, greater than 10 Ohm·cm. Use of a high resistivity material in this case is important, as its purpose is to reduce electrical signal losses. In a preferred embodiment, the transparent wafer can be made of any material with a relatively low dielectric constant along with a high transparency. For example, the transparent wafer 320 can be glass with a dielectric constant of $\in_r=4$. In the particular example illustrated in FIG. 3, the dielectric constant ($\in$) of the insulator 318 is $\in_r=3.9$, while the dielectric constant of dielectric layer 316 is $2\le\in_r\le3.9$. In addition, the dielectric constant of the chip package 314 is $2\le\in_r\le6$. As illustrated by structures 1120 and 1130 of FIG. 11, to attach the antenna chip layer or the antenna wafer layer to the high resistivity material 320 or 1122, which can be borofloat glass, the material 320 or 1122 can be coated with an adhesive layer 1124, such as the polyamide adhesive described above with respect to step 204, with a thickness of, for example, 2-3 µm. As discussed above with respect to step 204, the adhesive can be cured in the same way in an inert gas atmosphere prior to chip/wafer bonding to remove volatiles. The exposed SOI bottom layer 1104 can then be placed onto the adhesive layer 1124 on the high resistivity material 1122, ensuring air is not trapped. Any voids can cause device fracturing either during bonding or during laser release. As discussed above with respect to step 204, this can be accomplished by applying uniform heat and pressure during the bonding process. For example, the temperature can be elevated to the reflow temperature of the adhesive, for example, 300° C. for 10 minutes under a pressure of greater than 10 PSI if the polyamide adhesive is used, and then cooled slowly to room temperature to form the bond between the high resistivity material 320/1122 and the device layer 1106.

At step 210, the transparent support structure can be released from the antenna chip layer. For example, as illustrated by structure 1140 of FIG. 11, the mechanical support can be released from the circuit or wafer by illuminating the support and polymer adhesive with a light having a wavelength $\lambda_{polymer}$ to which the adhesive is sensitive. For example, the adhesive 1108 can be irradiated through the support wafer 1109 with an appropriate laser wavelength and energy to break the bond between the support wafer 1109 and the adhesive layer 1108. For example, a 308 nm laser at 500 mJ, at 16%-18%, power can be used if a polyamide adhesive is employed as adhesive layer 1108. In this example, four passes of the laser should be sufficient to break the bond. The carrier 1109 can then be removed from the device layer 1106 and the adhesive layer 1108 residue can be cleaned by reactive ion etching or chemical cleaning to expose the original top of the SOI circuitry of the device layer 1106. For example, nitride masked polishing can be employed to remove the adhesive residue. As indicated above, FIG. 3 illustrates an example of the resulting antenna structure 301 that can be formed in accordance with the method 200.

Returning to FIG. 1, the method 100 may proceed to step 104, at which a ground plane structure is separately formed. The ground plane structure can include one or more integrated ground planes that are configured to reflect the electromagnetic waves 302 emitted by the antenna(s) formed at step 102 toward the top of the chip. For example, as illustrated in FIG. 3, the ground plane 312 can be formed and integrated into a chip package 314, such as a printed circuit board. The ground plane can be fabricated by using a metal layer on top or inside the board layer. The board can be the widely used FR4 material or some other board material, and the metal can be copper or any other metal, such as aluminum, gold, etc.

At step 106, the antenna structure 301 can be mounted to the ground plane structure 314. For example, as illustrated in FIG. 3, the SOG circuit or wafer can be flip-chipped to the board 314 using a C4 or Cu pillar process. For example, the SOG circuit can be mounted to the carrier layer 314 with a connector 310 providing a ground for the antenna 306 and a connector 308 providing power and a signal to the IC 304. In accordance with various embodiments, the connectors 310 and 308 can, for example, be electrically conductive connectors, such as, for example, C4 or Cu pillar connectors. It should be noted that the mounting of the antenna structure 301 can implement a transfer of a single chip or a transfer of a full wafer. The full wafer transfer and its attachment to a board with, for example, C4, permits wafer-scale integration of large phase array chips and antennas. As illustrated in FIG. 3, the glass substrate 320 is disposed above the antenna(s) 306 on a side of the semiconductor chip 301 that opposes a side of the semiconductor chip by which the semiconductor chip is mounted on the chip package 314.

At step 108, the fabrication of the device can be completed. For example, a plurality of the devices 300 can be fabricated on a single wafer, which, optionally, can then be cut and separately integrated in wireless communication systems.

In the specific example illustrated in FIG. 3, the glass substrate thickness is between 50 and 700 µm. The antenna length is between λ/8 and λ, where λ is the electromagnetic wavelength. For example, for a 60 GHz signal, the wavelength is 2.5 mm, assuming the antenna is surrounded by a material with a dielectric constant of 4 (glass). Therefore, the antenna length in this embodiment is between 313 µm and 2.5 mm. In order to design a broadband antenna with good efficiency, the ground plane may, at step 106 of the method 100, be placed at a distance of about λ/4 below the antenna to achieve an optimal reflection. However, the distance (d) between the ground planes and the antennas should be between $$\frac{1}{20}\lambda < d \leq \frac{1}{4}\lambda$$

to achieve a relatively high efficiency with an acceptable bandwidth of at least 12% of the resonant frequency of the antennas. The predetermined distance or spacing between the antenna(s) 306 and the ground plane(s) 312 can be achieved by appropriately dimensioning the connectors 308 and 310.

For example, for a 60 GHz signal, the ground plane may be placed 625 µm below the antenna. The C4 pillar height between chip and package varies according to the pitch. For 200 µm pitch C4s, the height may be between 82 to 90 µm. For a 185.6 µm pitch, the C4 height may be 58 µm. With a 58 µm distance between the ground plane and the antenna, a 646 GHz broadband efficient antenna can be designed. Alternative known micro-bump technologies may offer a lower height, permitting the design of antennas working at even higher frequencies. On the lower frequency side, the structure is mostly limited by the chip size, since the ground plane height can be increased by increasing the board thickness. The maximum chip size is currently about 25 mm; therefore the theoretical low frequency limit for the structure in the embodiment of FIG. 3 is currently 750 MHz.

It should be noted that the choice of the distance between the antenna and ground plane is important because it permits a trade-off between antenna bandwidth and efficiency. An approximate equation for the patch antenna bandwidth is given by:

$$\frac{\Delta f}{f_{res}} = 1.2 \times \frac{d}{W}$$

where $\Delta f$ is the bandwidth, $f_{res}$ is the resonant frequency of the antenna, d is the distance from the ground plane to the antenna and W is the patch antenna width. Typically the patch antenna width W is equal to λ/2. For a 12% bandwidth, d is equal to W/10 or λ/20. For a frequency application of 60

GHz and for a material with a dielectric constant $\in_r$ of 4, the antenna width is 1250 μm, and the distance d from the ground to the antenna is 125 μm. Wider antenna bandwidth can be achieved by bringing the ground plane further away, however the antenna efficiency will degrade.

For a typical on-chip antenna, the distance d from the ground to the substrate is typically 10 μm. For a minimum 12% bandwidth target, which is typical for broadband applications, d is equal to W/10 or λ/20. Therefore the maximum wavelength is λ=200 μm for a target bandwidth of 12%. Assuming a typical dielectric constant of 4 between the on-chip antenna and the ground plane, the minimum frequency that can be used for on-chip patch antenna with a ground plane integrated on the same chip is 750 GHz with a 12% bandwidth. In accordance with exemplary embodiments of the present invention described herein, the distance d to the ground plane is a free parameter, and the minimum frequency is limited by the size of the chip reticule, which is typically 25 mm. For a 25 mm patch antenna, the wavelength λ=5 mm, and the distance between the antenna and the ground plane is 2.5 mm for a 12% frequency bandwidth target. The operating antenna center frequency is 3 GHz. Therefore, with the hybrid antenna integration described herein, frequency applications from 3 to 700 GHz can be supported, as compared to on-chip antennas and ground planes, which can only support frequency application of above 750 GHz for broadband applications.

Figure 4:
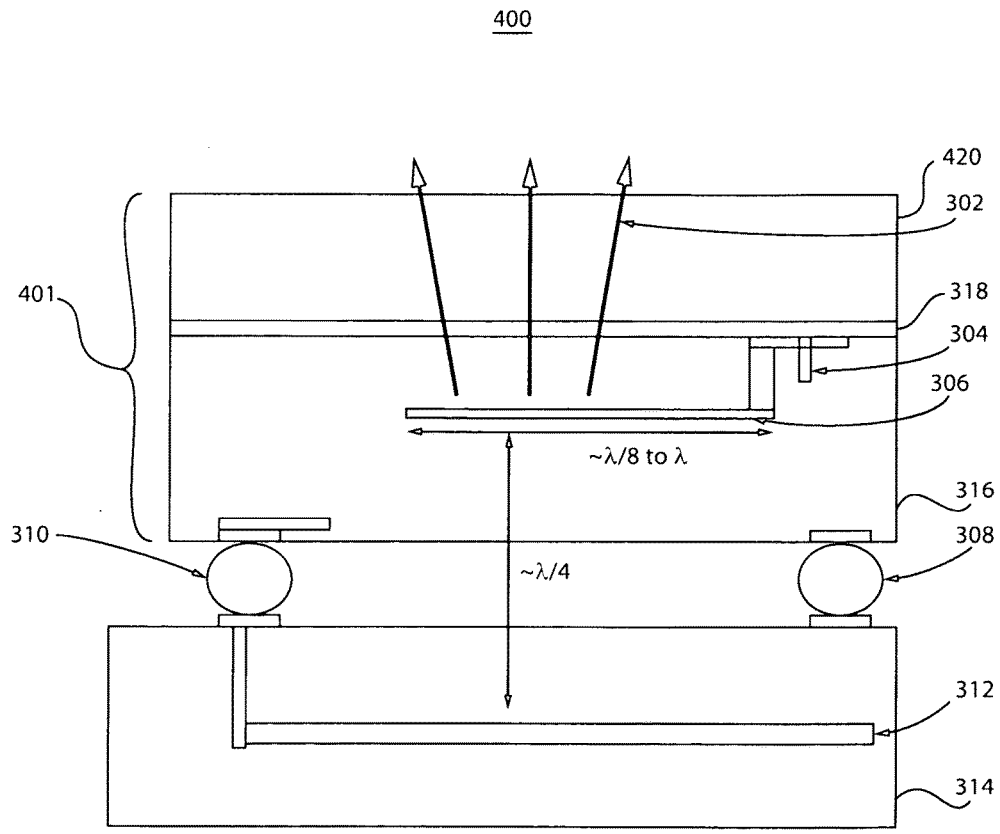
FIG. 4 is a cross-sectional view of an exemplary antenna device including a semiconductor cap in accordance with an exemplary embodiment.

FIG. 4 illustrates an alternative embodiment 400 of an antenna device, which can also be fabricated in accordance with the method 100 of FIG. 1. Here, the on-chip hybrid antenna device is implemented with an SOI technology, where the ground plane is integrated within the board or chip package 314. The embodiment 400 is essentially the same as that of FIG. 3, except that an SOI antenna layer structure 401, such as the antenna layer structure formed in step 202 of the method 200, is formed at step 102 and is mounted on the ground plane structure or carrier layer 314 at step 106. The antenna is integrated onto a medium-to-high resistivity substrate 420, for example, with a resistivity of about 100 Ohm·cm to greater than 1 KOhm·cm, depending on the frequency of transmission through the substrate 420. Further, the ground plane 312 is integrated into the board 314, as discussed above with respect to FIG. 3. The SOI chip is directly flip-chipped on the board at step 106. The dimensions are the same as for the structure in FIG. 3. The silicon substrate 420 has a dielectric constant of $\in$=11.9 and is lossy. Due to the lossy properties of the substrate 420, this embodiment does not lead to an antenna efficiency as high as that of the embodiment of FIG. 3.

Figure 5:
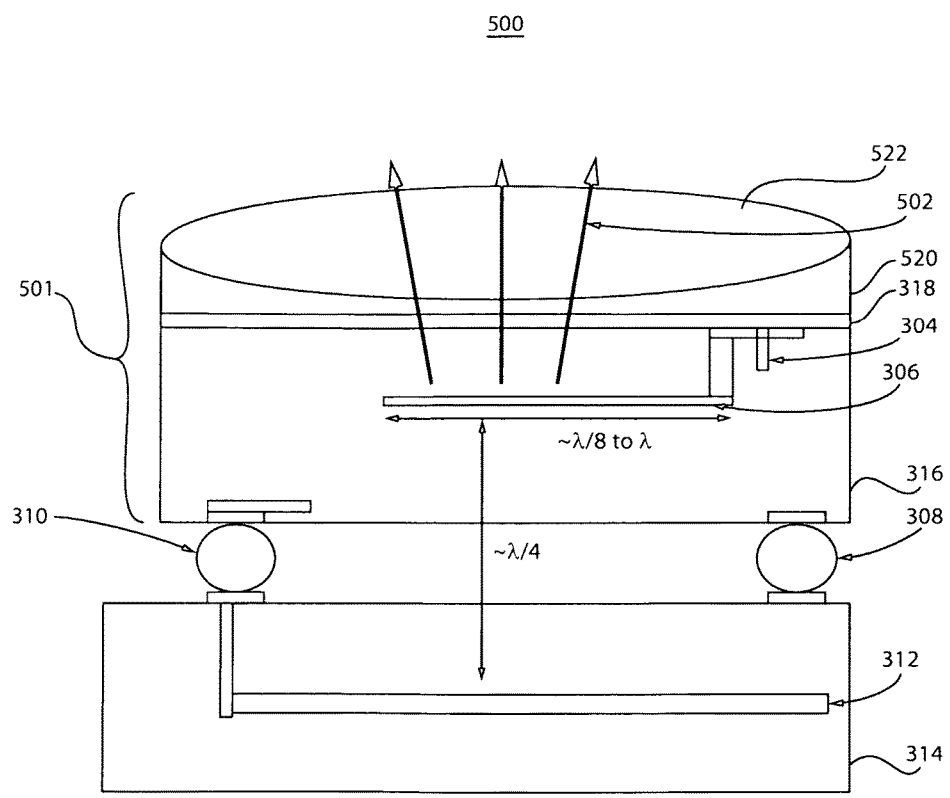
FIG. 5 is a cross-sectional view of an exemplary antenna device including a lens cap in accordance with an exemplary embodiment.

FIG. 5 illustrates another embodiment 500 in which a lens 522 is fabricated in the silicon substrate 420 of the SOI structure 401 of FIG. 4, thereby forming the antenna structure 501 with the cap layer 520. The lens 522 can be formed at step 102 of the method 100 by chemical or plasma etching. The dielectric lens 522 is configured to focus the incident electromagnetic wave 502 on the antenna and to improve its directivity and receiver sensitivity. The diameter of the lens is can be between λ/8 and 2λ. Other than the lens 522 and the silicon substrate 520, the device 500 is essentially the same as the devices 300 and 400 of FIGS. 3 and 4, and can be formed as discussed above with respect to the embodiment 400 of FIG. 4 with the addition of forming a lens at steps 102/202. It should be noted that in this, and all other embodiments, the antenna 306 can be configured to both receive and transmit signals.

Figure 6:
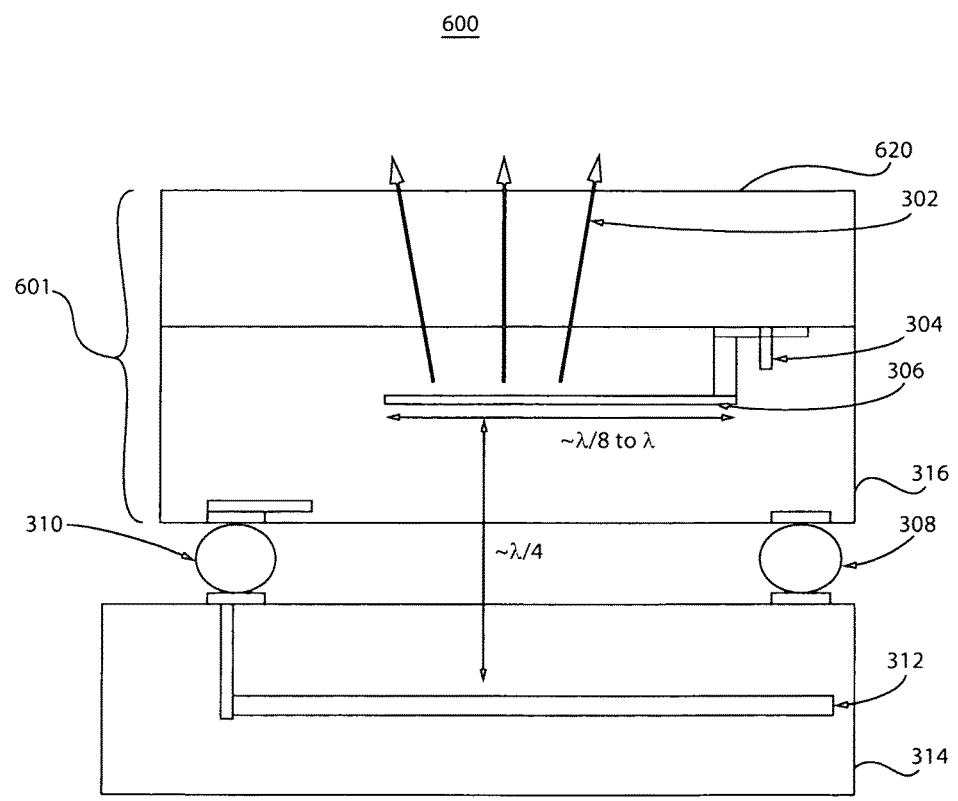
FIG. 6 is a cross-sectional view of an exemplary antenna device including a semiconductor cap formed from a bulk semiconductor material in accordance with an exemplary embodiment.

Referring now to FIG. 6, an alternative embodiment 600 of an antenna device, which can also be fabricated in accordance with the method 100 of FIG. 1, is illustratively depicted. Here, the on-chip hybrid antenna device is implemented with a bulk semiconductor technology, where the ground plane is integrated within the board or chip package 314. Similar to FIGS. 4 and 5, the antenna is integrated onto a medium-to-high resistivity substrate 620, for example, with a resistivity of about 100 Ohm·cm to greater than 1 KOhm·cm that is dependent on the frequency of transmission through the substrate 620. The embodiment 600 is essentially the same as that of FIG. 3, except that the antennas are formed at step 102 in a bulk semiconductor 620, such as silicon, as opposed to an SOI antenna structure 301, to form an antenna structure 601. Step 104 can be implemented as discussed above and the antenna structure 601 can be mounted on the ground plane structure or carrier layer 314 at step 106, as discussed above. Further, the ground plane 312 is integrated into the board 314, as discussed above with respect to FIG. 3. The dimensions are the same as those in FIG. 3 to obtain the ~λ/4 to λ/20 spacing from the antenna(s) 306 to the ground plane 312.

Figure 7:
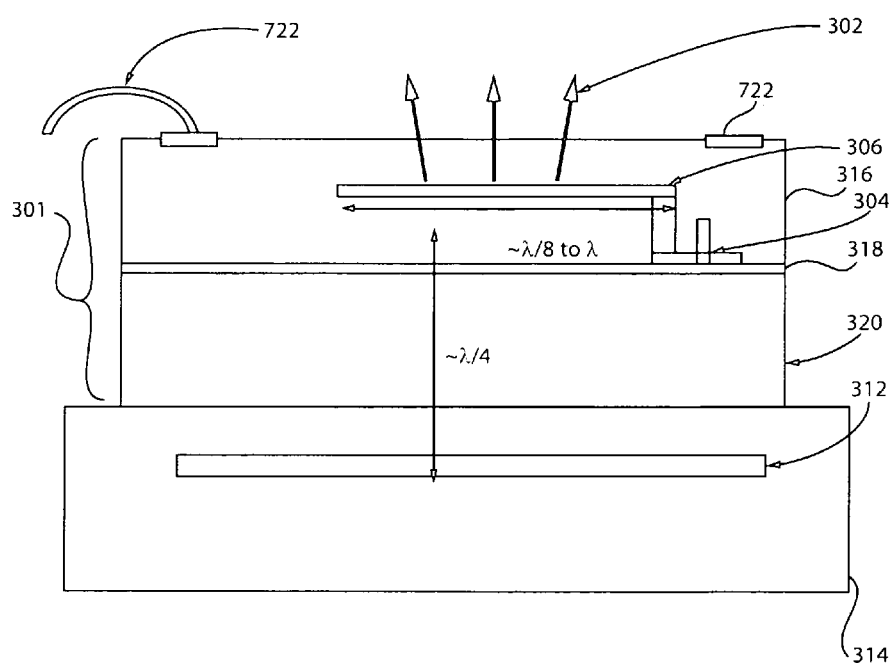
FIG. 7 is a cross-sectional view of an exemplary antenna device including an antenna structure that is directly bonded to a package in accordance with an exemplary embodiment.

With reference to FIG. 7, another embodiment 700 of an antenna device in accordance with exemplary aspects of the present principles is illustratively depicted. The antenna device 700 of FIG. 7, like the antenna device of FIG. 3, is directed to a hybrid on-chip antenna device with one or more antennas integrated into an SOG structure and one or more ground planes integrated within the board or chip package. In particular, the device 700 is essentially the same as that of FIG. 3 except that the antenna structure 301 is not flip-chipped onto the chip package 314 and connectors 310 and 316 are not used. Here, in the device 700, the glass substrate 320 is directly bonded to the ground plane structure 314 and wire bonds 722 are mounted onto the semiconductor chip 301 and are thereby connected to the antenna(s) 306, as illustrated in FIG. 7. The wire bonds 722 connect the chip 301 to the package 314 and provide a signal/power and a ground to the antenna(s), as illustrated in FIG. 7. Thus, to manufacture the device 700, the methods 100 and 200 can be performed as described above with respect to the device 300 of FIG. 3, except that the glass substrate 320 of the antenna structure 301 is directly bonded to the ground plane structure 314 at step 106, that the wire bonds 722 are mounted on the antenna structure 301 at step 108 and that the glass substrate 320 is optionally etched at step 102 and/or step 206. As illustrated in FIG. 7, the wire bonds 722 are disposed on a top surface of the semiconductor chip 301 that opposes a side of the semiconductor chip by which the semiconductor chip is mounted on the chip package 314. In addition, prior to attaching the glass substrate 320 to the antenna chip layer, as discussed above, the glass substrate 320 can be etched and dimensioned such that the ground plane(s) 312 is at a predetermined distance from the antenna(s) 306. As discussed above, the predetermined distance may about λ/4 to achieve an optimal reflection. However, the predetermined distance (d) can be between $$\frac{1}{20}\lambda < d \leq \frac{1}{4}\lambda$$

to achieve a relatively high efficiency, as noted above. Use of the high resistivity, highly transparent material 320 in this way can reduce signal losses that would otherwise occur if a semiconductor substrate were used instead of the high resistivity material 320. For example, the use of material 320 can reduce signal losses that may otherwise occur as a result of reflections of the signal through the semiconductor substrate from the ground plane(s) 312.

Figure 8:
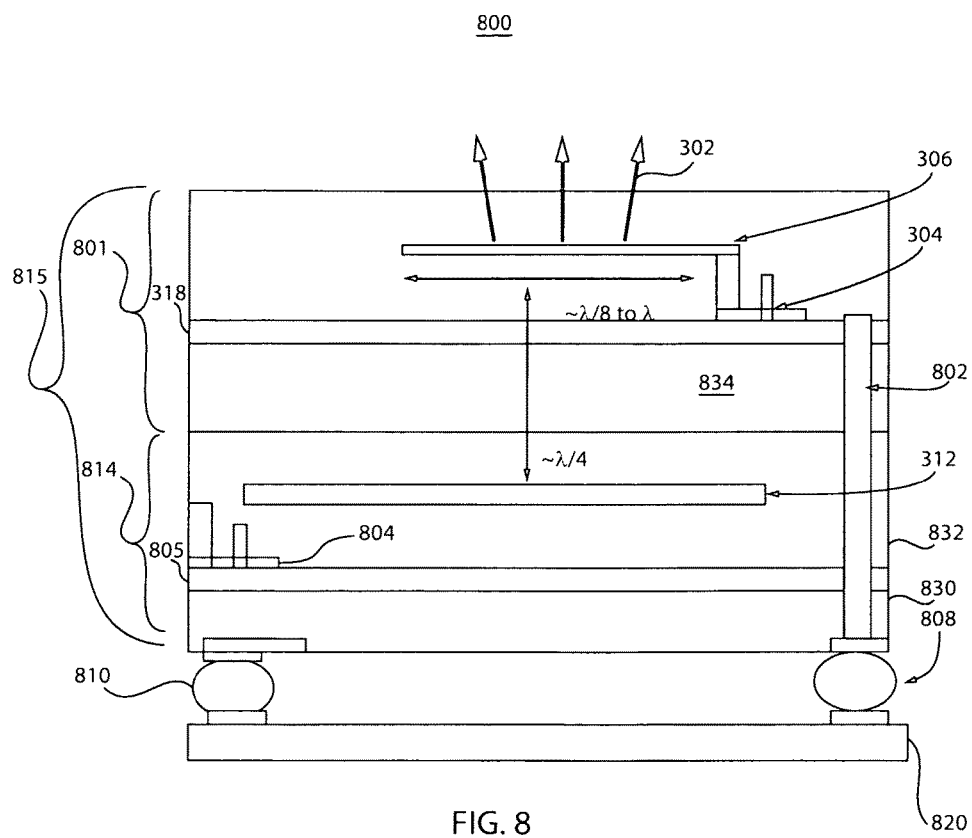
FIG. 8 is a cross-sectional view of an exemplary antenna device that is fabricated with 3D integration technology in accordance with an exemplary embodiment.

FIG. 8 illustrates an alternative embodiment 800 in which the hybrid antenna structure 815 is composed of an on-chip antenna(s) 306 integrated into an SOG structure and a ground plane(s) 312 integrated within another chip. 3-D chip integration technology can be employed to fabricate this embodiment. Here, in the example illustrated in FIG. 8, the chip 815 is connected by using connectors 810 and 808, which can be C4 pillars or micro-bumps, and using a Through-Silicon Via (TSV) or a Through-Glass Via (TGV) 802. The dimensions and SOG processing are essentially the same as for the structure 300 in FIG. 3. In addition, the antenna device 800 can be fabricated by performing the method 100 of FIG. 1 discussed above.

For example, referring again specifically to FIGS. 1 and 2, with continuing reference to FIG. 8, the method 100 can begin by forming the structure 301 in accordance with step 102 and the method 200, as discussed above with respect to the device 300 of FIG. 3, where the substrate 834 can be a glass substrate 320. Alternatively, the substrate 834 can be composed of silicon with a dielectric constant of $\in_r=4$. Here, the antenna structure 801 can be an SOI structure and can be formed as discussed above, for example, with respect to the SOI structure 301 of FIG. 3. Alternatively, the antenna structure 814 can be formed in bulk silicon, as discussed above, for example, with respect to antenna layer structure 601 of FIG. 6. Thus, in this case, the insulator layer 318 can be omitted.

Figure 9:
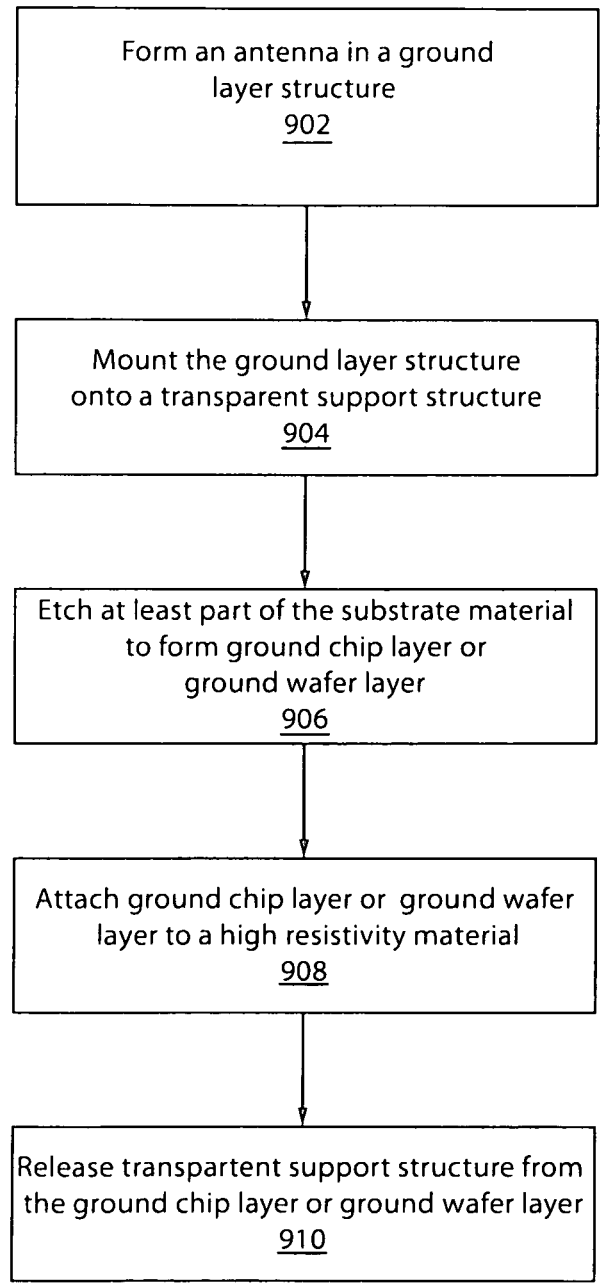
FIG. 9 is a block/flow diagram of a method for forming a ground plane structure illustrated in FIG. 8 in accordance with an exemplary embodiment.

At step 104, the ground plane structure 814 can be fabricated in accordance with a method 900 that is similar to the method 200 of FIG. 2. For example, a flow diagram of a method 900 for forming a ground plane structure 814 is illustratively depicted in FIG. 9. Here, the method 900 can begin at step 902, at which one or more antennas are formed in a ground layer structure. As illustrated in FIG. 8, one or more ground planes 312 can be formed in a silicon-on-insulator (SOI) structure, which includes an insulator layer 805 and a semiconductor substrate, such as a silicon substrate (not shown). Further, the ground plane 312 can be insulated with a dielectric material 832, with, for example, a dielectric constant of $2 \leq \in_r \leq 3.9$. The ground plane structure 814 also includes antenna device components 804 of an active device of an SOI structure. As discussed above, with respect to the FIG. 3 embodiment, the SOI structure can be transferred onto a glass substrate to form a Silicon On Glass (SOG) structure.

For example, at step 904, the ground structure formed in step 902 can be mounted onto a transparent support structure. For example, the SOI chip or wafer can be attached to a mechanical support wafer using a polymer glue that is sensitive to a certain light wavelength $\lambda_{polymer}$. The mechanical support wafer used is transparent at the light wavelength $\lambda_{polymer}$, as discussed above with respect to FIG. 2.

At step 906, at least part of the substrate material can be etched to form ground chip layer or a ground wafer layer. For example, the chip back-side substrate (not shown in FIG. 8) of a single chip or multiple chips on a wafer can be etched away using mechanical polishing/etching and/or chemical etching and/or plasma etching, as discussed above with respect to FIG. 2. As noted above, an advantage of using an SOI structure is that the silicon chemical or plasma etching is very selective with respect to $SiO_2$ of the insulator layer 805, enabling the etching process to be stopped automatically at the appropriate distance without damaging the active devices 804 integrated into the silicon film and isolated from the substrate by the $SiO_2$ box 805.

At step 908, the ground chip layer or the ground wafer layer can be attached to a transparent wafer 830. For example, the chip or wafer that is attached to the mechanical support wafer is then attached to a transparent wafer, such as glass, as discussed above with respect to FIG. 2. The transparent wafer 830 can be glass with a dielectric constant of $\in_r=4$.

At step 910, the transparent support structure can be released from the ground chip layer. For example, the mechanical support can be released from the circuit or wafer by illuminating the support and polymer adhesive with a light having a wavelength $\lambda_{polymer}$ to which the adhesive is sensitive, as discussed above with respect to FIG. 2. As indicated above, FIG. 8 illustrates an example of the resulting ground plane structure 814 that can be formed in accordance with the method 900.

It should also be noted that the substrate 830 in alternative embodiments can be composed of silicon with a dielectric constant of $\in_r=11.9$. Here, the ground plane structure 814 can be an SOI structure and can be formed as discussed above, for example, with respect to the SOI structure 401 of FIG. 4. Alternatively, the ground plane structure 814 can be formed in bulk silicon, as discussed above, for example with respect to antenna layer structure 601 of FIG. 6. Thus, in this case, the insulator layer 805 can be omitted.

Returning to the method 100, the method may proceed to step 106, at which the antenna structure 801 can be mounted to the ground plane structure 814. It should be noted that layer 834 can be etched and dimensioned at step 102 and/or layer 832 can be etched and dimensioned at step 104 to ensure that the ground plane(s) 312 is at a predetermined distance from the antenna(s) 306. As discussed above, the predetermined distance (d) can be between $$\frac{1}{20}\lambda < d \leq \frac{1}{4}\lambda$$

to achieve a relatively high efficiency, and is preferably about $\lambda/4$.

At step 108, a via 802, such as a TGV or a TSV, can be formed in the structures 801 and 814, as illustrated in FIG. 8. As also illustrated in FIG. 8, the via 802 electrically couples the chip 801 and the chip package 820 through the chip 814. In addition, the hybrid antenna chip 815 can be flip-chipped to the chip package 820 using a C4 or Cu pillar process. For example, the chip can be mounted to the chip package 820, which can be a printed circuit board, with a connector 810 and a connector 808 providing power and a signal to the antenna(s) 306. It should be noted that a single ship or a full wafer can be mounted to the chip package 820 through connectors 808 and 810, which can permit wafer-scale integration of large phase array chips and antennas. In accordance with various embodiments, the connectors 810 and 808 can, for example, be electrically conductive connectors, such as, for example, C4 or Cu pillar connectors.

Figure 10:
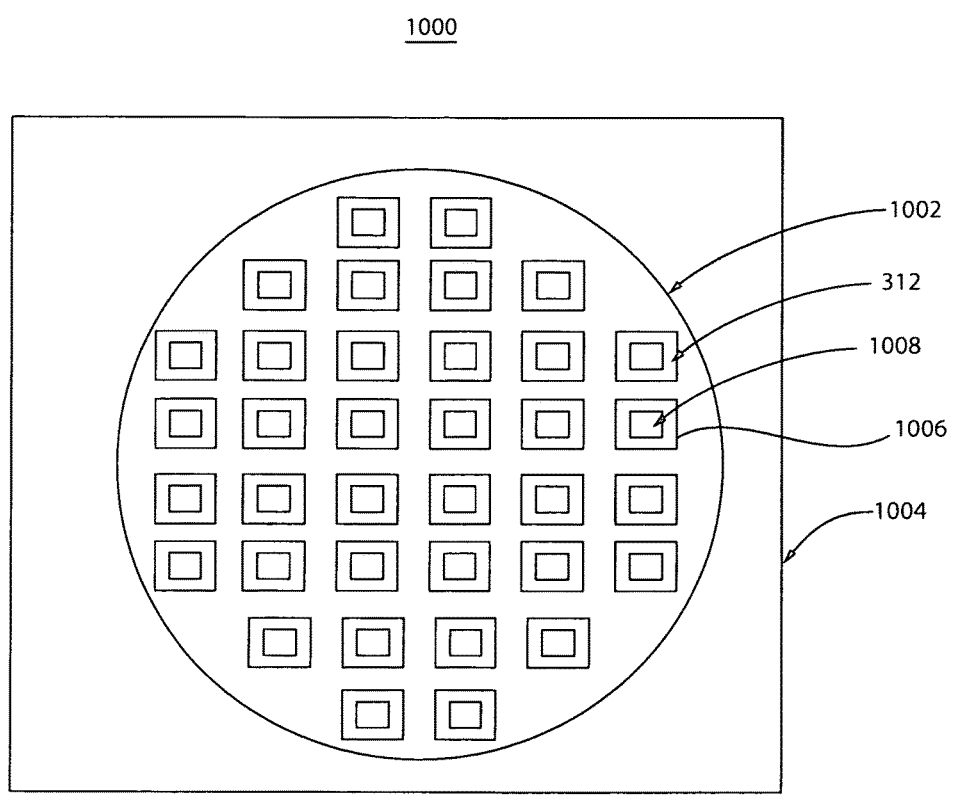
FIG. 10 is a cross-sectional top view of wafer-scale antenna system with a large antenna array in accordance with an exemplary embodiment.

With reference now to FIG. 10, a top view of a wafer-scale antenna system 1000 with a large antenna array in accordance with an exemplary embodiment is illustratively depicted. Here, the system 1000 can comprise a wafer 1002, which is illustrated as outline 1002. The wafer 1002 includes a plurality of antenna devices 1006, each of which includes one or more chips 1008, which in turn can include one or more antennas 306, and one or more ground planes 312.

Each of the antenna devices 1006 can be, for example, the antenna device 300, the antenna device 400, the antenna device 500 or the antenna device 600 described above with respect to FIGS. 3, 4, 5 and 6, respectively, where the chips 1008 can be chips 301, 401, 501 or 601. The wafer 1002 can be flip-chip bonded to a chip package 1004, which, as noted above can be a printed circuit board. The chip package 1004 can be a chip package that is common to all of the devices 1006. Thus, the chip package 1004 can be one large package of which the chip packages 314, in which the ground planes are integrated, as discussed above, are apart. In accordance with one exemplary aspect, as indicated above, the wafer 1002 can be attached to the package 1004 using C4 or micro-bump packaging technology. This permits the scaling of the antenna devices to the wafer level, enabling the use of hundreds of antennas in a single system, and even thousands, depending on the frequency employed. Accordingly, a hybrid integration of a large number of antennas and transceivers can be implemented to build a large antenna array. A typical wafer dimension is between 200 mm and 300 mm in the width and/or length of the wafer 1002 in the top view shown in FIG. 10. However, any wafer dimension can be used in accordance with various embodiments of the present principles.

It should be noted that the transmissions described herein preferably have a milliwave wavelength or less, for example, frequencies of approximately 60 GHz to 1 THz. However, the antenna devices can be adapted for transmissions with other frequencies, such as RF, in accordance with the dimensions described above with respect to the wavelength of the transmitted waves.

The hybrid antenna integration described herein allows for flexibly in changing the distance between the antenna(s) and ground plane(s) to provide for the design of broadband antennas. In particular, the structure enables the implementation of an optimal spacing between the ground plane and the antenna(s) to maximize in-phase reflection and thereby improve efficiency.

Having described preferred embodiments of hybrid on-chip and package antenna devices, systems and methods of their fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An antenna device comprising:
   a semiconductor chip including at least one antenna integrated into a dielectric layer of the semiconductor chip and configured to transmit electromagnetic waves; and
   a chip package on which said semiconductor chip is mounted, wherein the chip package includes at least one ground plane that is entirely enclosed solid dielectric material within the chip package that is disposed at a predetermined distance from the at least one antenna to implement a reflection of at least a portion of the electromagnetic waves by the at least one ground plane, wherein the electromagnetic waves have a microwave or lower wavelength ($\lambda$), wherein said distance (d) is between $$\frac{1}{20}\lambda < d \leq \frac{1}{4}\lambda.$$

2. The antenna device of claim 1, wherein said distance is about $\lambda/4$.

3. The antenna device of claim 1, further comprising:
   at least one connector by which said semiconductor chip is mounted on said chip package, wherein the at least one connector is dimensioned such that the at least one ground plane is at the predetermined distance from the at least one antenna.

4. The antenna device of claim 1, wherein the at least one connector is electrically conductive to provide at least one of a ground, a signal or power.

5. The antenna device of claim 4, wherein the at least one connector comprises at least one of C4 or Cu pillar connectors.

6. The antenna device of claim 1, wherein said chip package is a printed circuit board.

7. The antenna device of claim 1, wherein the semiconductor chip is a silicon on glass (SOG) structure.

8. The antenna device of claim 7, wherein the semiconductor chip comprises a glass substrate that is disposed above the at least one antenna on a side of the semiconductor chip that opposes a side of the semiconductor chip by which the semiconductor chip is mounted on the chip package.

9. The antenna device of claim 7, wherein a glass substrate of the SOG structure is directly coupled to the chip package and is dimensioned such that the at least one ground plane is at the predetermined distance from the at least one antenna.

10. The antenna device of claim 9, further comprising a wire bond disposed on a top surface of the semiconductor chip that opposes a side of the semiconductor chip by which the semiconductor chip is mounted on the chip package.

11. The antenna device of claim 1, wherein the semiconductor chip is a silicon on insulator (SOI) structure.

12. The antenna device of claim 1, wherein the semiconductor chip comprises a lens in a silicon substrate disposed above the at least one antenna on a side of the semiconductor chip that opposes a side of the semiconductor chip by which the semiconductor chip is mounted on the chip package, wherein said lens is configured to focus received electromagnetic waves to said at least one antenna.

13. A method for fabricating an antenna device for microwave transmissions comprising:
   forming an antenna structure comprising at least one antenna integrated into a dielectric layer of a semiconductor chip and configured to transmit electromagnetic waves having a microwave wavelength ($\lambda$);
   forming a ground plane structure separately from said antenna structure, wherein the ground plane structure comprises at least one integrated ground plane enclosed in its entirety in solid dielectric material within a chip package that is configured to reflect the electromagnetic waves; and
   mounting said antenna structure to said ground plane structure such that the at least one ground plane is at a distance (d) of $$\frac{1}{20}\lambda < d \leq \frac{1}{4}\lambda$$

from the at least one antenna.

14. The method of claim 13, wherein the ground plane structure is a printed circuit board.

15. The method of claim 13, wherein the antenna structure comprises a glass substrate that is disposed above the at least one antenna on a side of the antenna structure that opposes a side of the antenna structure by which the antenna structure is mounted on the ground plane structure.

16. The method of claim 13, wherein the semiconductor chip is a first chip, wherein the ground plane structure is a second chip, wherein the first chip and second chip are mounted on a circuit board and wherein the circuit board and the first chip are electrically connected through the second chip with at least one of a through silicon via (TSV) or a through glass via (TGV).

17. An antenna system comprising:

a plurality of semiconductor chips on a wafer, wherein each of the semiconductor chips includes at least one antenna that is integrated into a dielectric layer of the semiconductor chip and is configured to transmit electromagnetic waves; and a wafer-scale chip package on which said wafer and said plurality of semiconductor chips are mounted, wherein the chip package includes ground planes integrated enclosed in its entirety in solid dielectric material within the wafer-scale chip package that are disposed at predetermined distances from the antennas of the semiconductor chips to implement a reflection of at least a portion of the electromagnetic waves by the ground planes.

* * * * *